United States Patent
Wu (10) Patent No.: US 6,623,293 B1
(45) Date of Patent: Sep. 23, 2003

(54) BATTERY HOLDER HAVING MEANS FOR SECURELY RETAINING BATTERY IN POSITION

(75) Inventor: Jerry Wu, Tu-Chen (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/116,293

(22) Filed: Apr. 3, 2002

(51) Int. Cl.[7] .......................... H01R 3/00; H01M 2/10
(52) U.S. Cl. .................... 439/500; 439/627; 429/99
(58) Field of Search ............................ 439/500, 627, 439/698, 830; 429/100, 96, 97, 99

(56) References Cited

U.S. PATENT DOCUMENTS

| | | | | |
|---|---|---|---|---|
| 3,181,974 A | * | 5/1965 | Barbera ........................ 429/100 |
| 5,211,579 A | * | 5/1993 | Seong et al. ................. 439/500 |
| 5,395,263 A | * | 3/1995 | Sandell ........................ 439/500 |
| 5,586,907 A | * | 12/1996 | Frantz et al. ................. 439/500 |
| 6,087,037 A | * | 7/2000 | Rieder ........................... 429/99 |

* cited by examiner

*Primary Examiner*—Hien Vu
(74) *Attorney, Agent, or Firm*—Wei Te Chung (57) ABSTRACT

A battery holder (1) comprises an insulative housing (10) defining a receiving space (15) for receiving a battery (40) and a pair of negative and positive conductive contacts (20, 60) fastened to opposite ends of the housing. Each of the negative and positive conductive contacts forms a base section (22, 62), a spring arm (26, 63) extending from one end of the base section for electrically connecting with a corresponding negative or positive terminal of the battery, and a soldering tail (25, 66) extending from another end of the base section for soldering to a circuit board. Furthermore, one of the first and second conductive contacts forms a pair of clip members (64) extending from opposite sides of the base section for conductively abutting against an outer surface (45) of the battery for preventing the battery from moving or offsetting under variation situations.

11 Claims, 10 Drawing Sheets

BATTERY HOLDER HAVING MEANS FOR SECURELY RETAINING BATTERY IN POSITION

BACKGROUND OF THE INVENTION

1. Field of the Invention

The present invention generally relates to a battery holder for holding and mounting a battery to for example a circuit board, and more particular to a battery holder having improved conductive contacts for both electrically engaging and reliably retaining the battery in place when the battery is inserted into the battery holder.

2. Description of Prior Art

Battery holders have been employed for holding various forms of batteries, such as back up batteries for real time clocks in desk top computers. These batteries are typically 1/2 AA batteries and the battery holder is installed on the main or other circuit boards of the computer by terminal tails which are inserted into the circuit boards and soldered to the appropriate electrical circuit of the boards.

Such 1/2 AA battery holders are disclosed in U.S. Pat. Nos. 5,211,579, 5,395,263, 6,124,056, 5,827,619. Generally, a 1/2 AA battery has a cylindrical body having a first flat end surface, serving as a negative terminal, and a second end surface from which a protrusion concentrically projects, serving as a positive terminal. The battery holder is equipped with positive and negative contacts that electrically and respectively engage with positive and negative terminals of the battery for routing the electrical current from the battery to a power-consuming device to which the contacts of the battery holder are connected. Batteries of this type are sometimes adopted as backup power supply in a computer system. In that case, the positive and negative contacts of the battery holder are electrically connected to a main circuit board of the computer system.

However, the battery holder disclosed in each of the above mentioned U.S. patents is not provided with an effective means to retain the battery in place. Thus, the battery may be moved out of the holder or deviated from its original position during transportation or under a vibrating environment, thereby adversely affecting the electrical connection between the terminals of the battery and corresponding contacts of the battery holder. Hence, an improved battery holder is required to overcome the disadvantages of the prior art.

BRIEF SUMMARY OF THE INVENTION

A first object of the present invention is to provide a battery holder equipped with a conductive contact which can effectively retain the battery in place when the battery is inserted into the battery holder;

A second object of the present invention is to provide a battery holder equipped with a conductive contact which has a low manufacturing cost and is simple in assembling.

A battery holder in accordance with the present invention is adapted to retain a battery having opposite first and second end faces, the first end face forming a first electrical terminal of the battery, a reduced projection extending from the second end face to form a second electrical terminal of the battery. The battery holder comprises an insulative housing and a pair of first and second conductive contacts fastened to opposite ends of the housing. The housing has two opposite side walls and two opposite first and second end blocks connected with the side walls to cooperatively define a receiving space for receiving a battery. The fist and second conductive contacts are respectively engaged with the first and second end blocks of the housing, and each forms a base section, a spring arm extending from one end of the base section for electrically connecting with one of the first and second electrical terminals of the battery when the battery is inserted in the receiving space, and a soldering tail extending from another end of the base section for soldering to a circuit board. Furthermore, one of the first and second conductive contacts forms a pair of clip members extending from opposite lateral sides of the base section for conductively abutting against an outer surface of the battery when the battery is disposed in the receiving space, thereby preventing the battery from moving or offsetting under variation situations.

Other objects, advantages and novel features of the invention will become more apparent from the following detailed description of the present embodiment when taken in conjunction with the accompanying drawings.

DETAILED DESCRIPTION OF THE INVENTION

Figure 10:
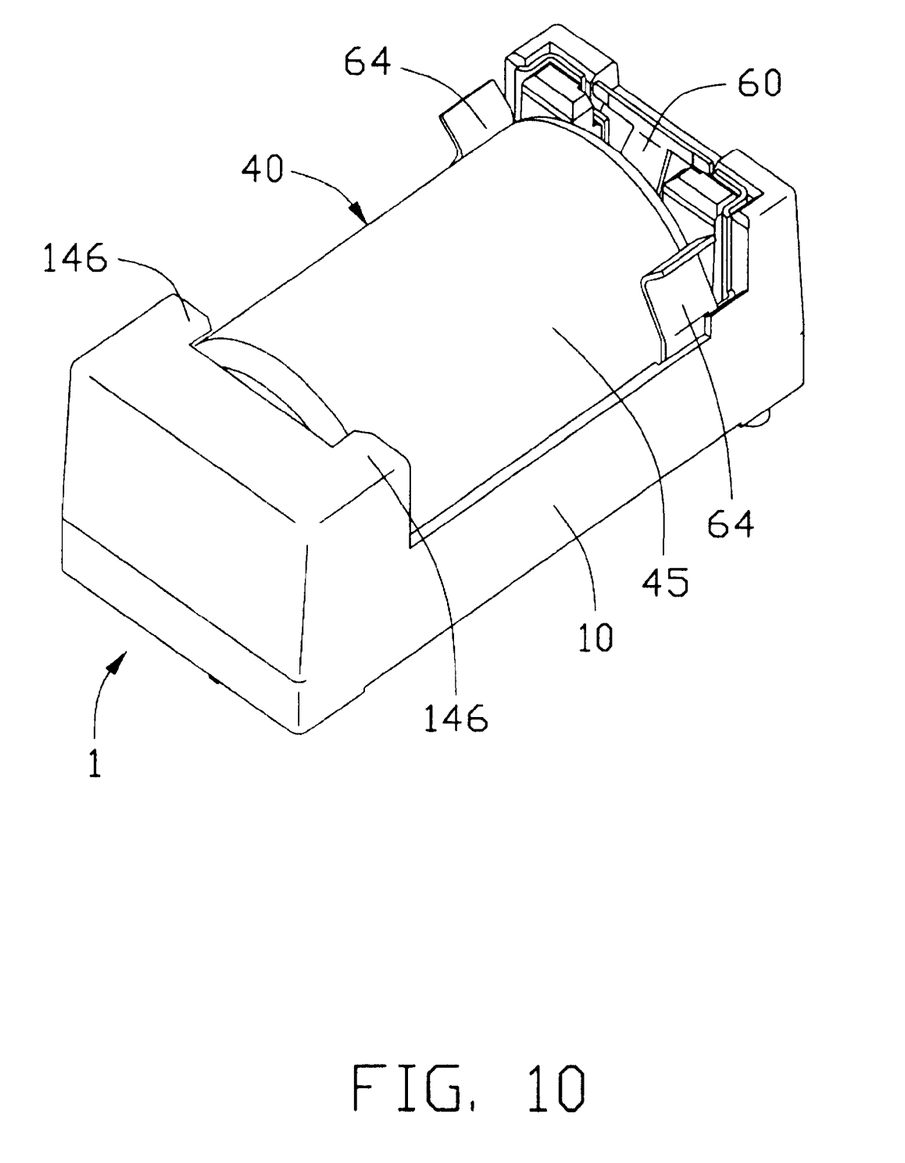
FIG. 10 is an assembled perspective view of the battery holder of FIG. 3 and a battery.
Figure 11:
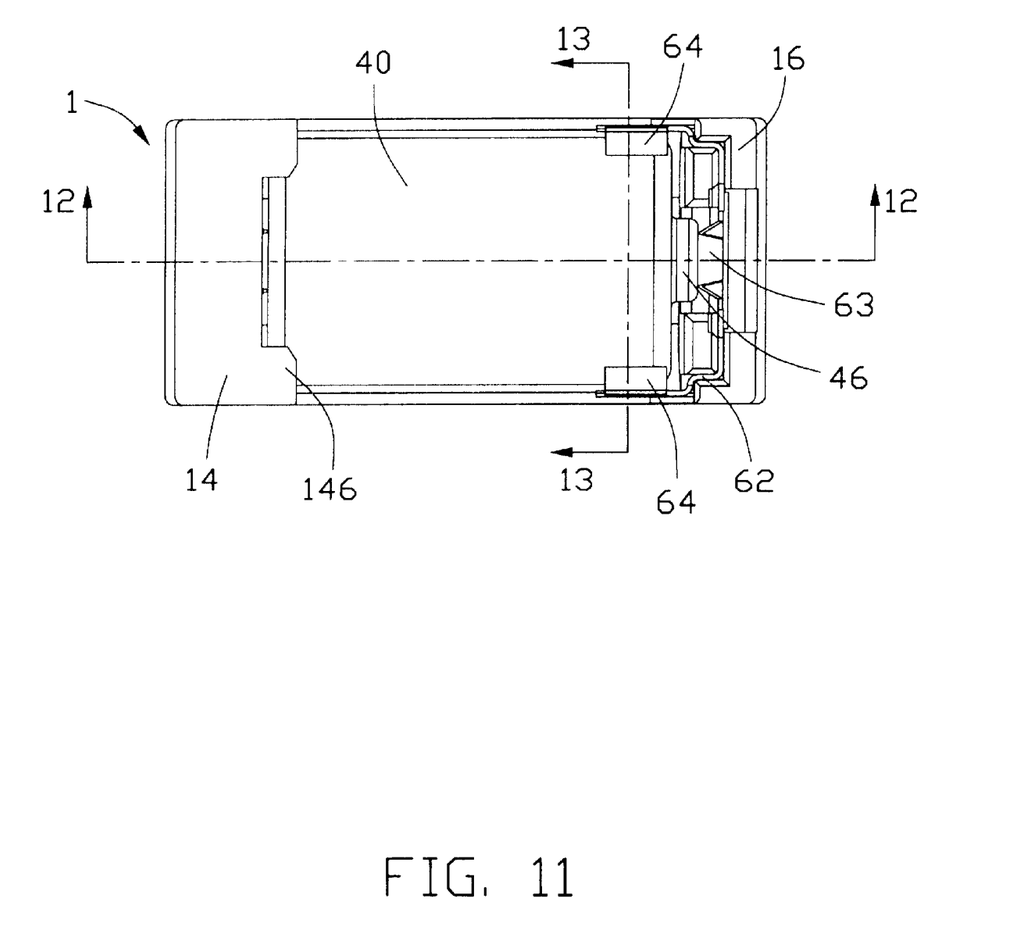
FIG. 11 is a top view of FIG. 10.
Figure 12:
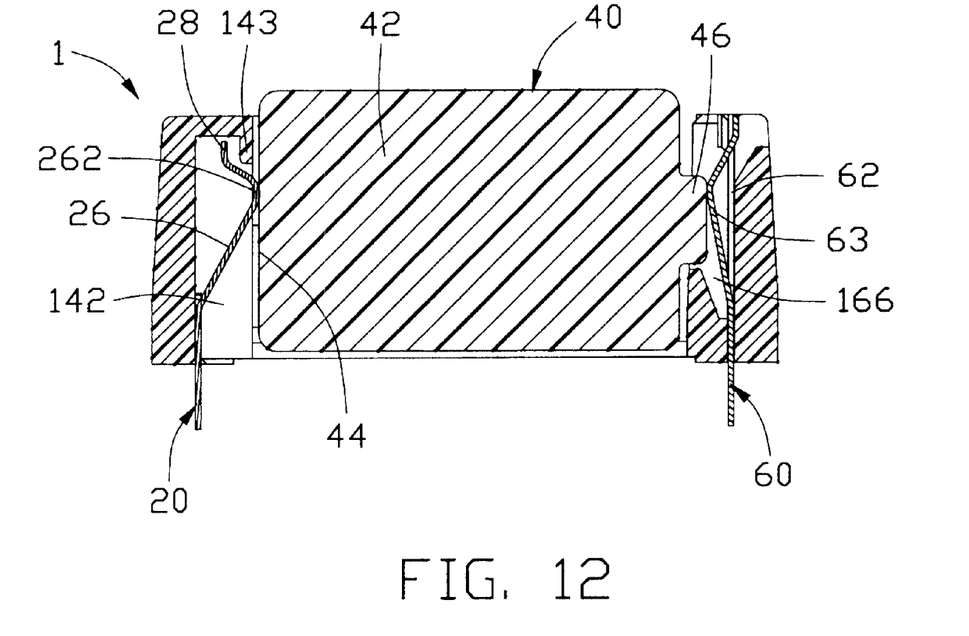
FIG. 12 is a cross-sectional view taken along line 12—12 of FIG. 11.
Figure 13:
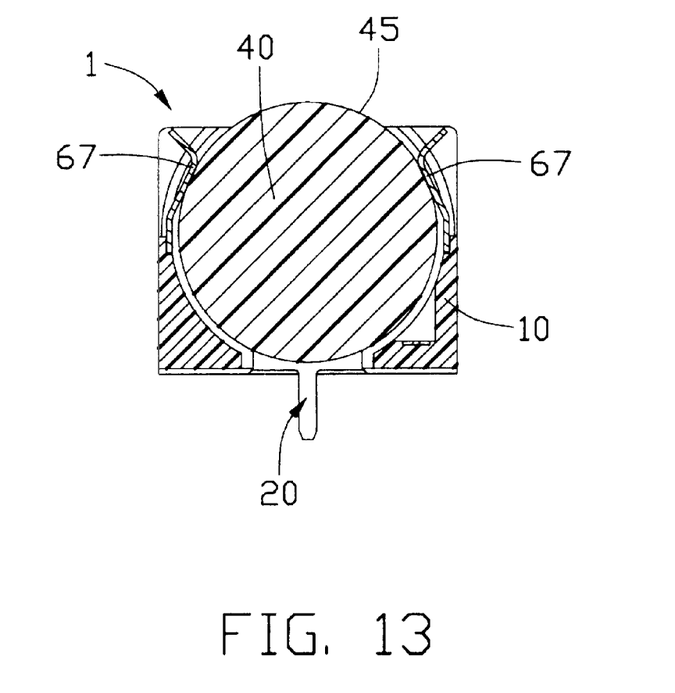
FIG. 13 is a cross-sectional view taken along line 13—13 of FIG. 13.

With reference to the drawings and in particular to FIGS. 1 to 4, a preferred embodiment of a battery holder 1 constructed in accordance with the present invention is adopted for holding a battery 40 (FIG. 10) having a cylindrical body 42 and opposite end surfaces respectively forming a flat negative terminal 44 and a protruded positive terminal 46 (both see FIG. 12) for electrically connecting with an underlying circuit board (not shown). The battery holder 1 comprises a one-piece insulative housing 10 and first and second conductive contacts 20, 60 attached to opposite ends of the housing 10.

The housing 10 comprises a body 12 having a bottom surface 13 to be positioned on the circuit board. The body 12 further comprises front and rear end blocks 14, 16 connected by two opposite side walls 18 whereby a receiving space 15 is defined therebetween for receipt of the battery 40. Each side wall 18 has a curved inner face 182 in the space 15 for supporting the battery 40 in the holder body 12. The inner faces 182 of the side walls 18 are space from each other, thereby defining a bottom opening 184 therebetween. The bottom opening 184 communicats with the receiving space 15.

Figure 1:
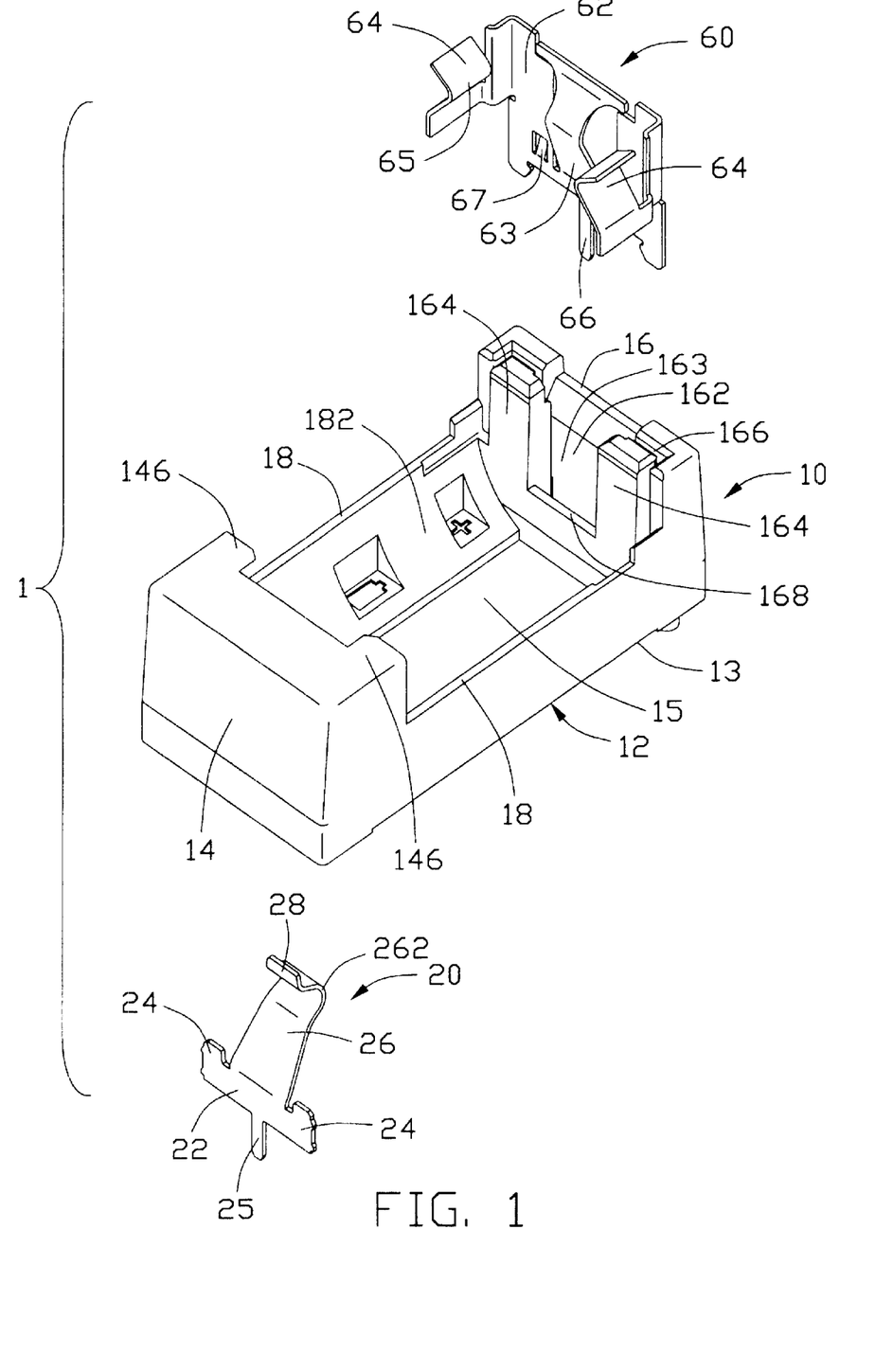
FIG. 1 is an exploded perspective view of a battery holder in accordance with the present invention.
Figure 2:
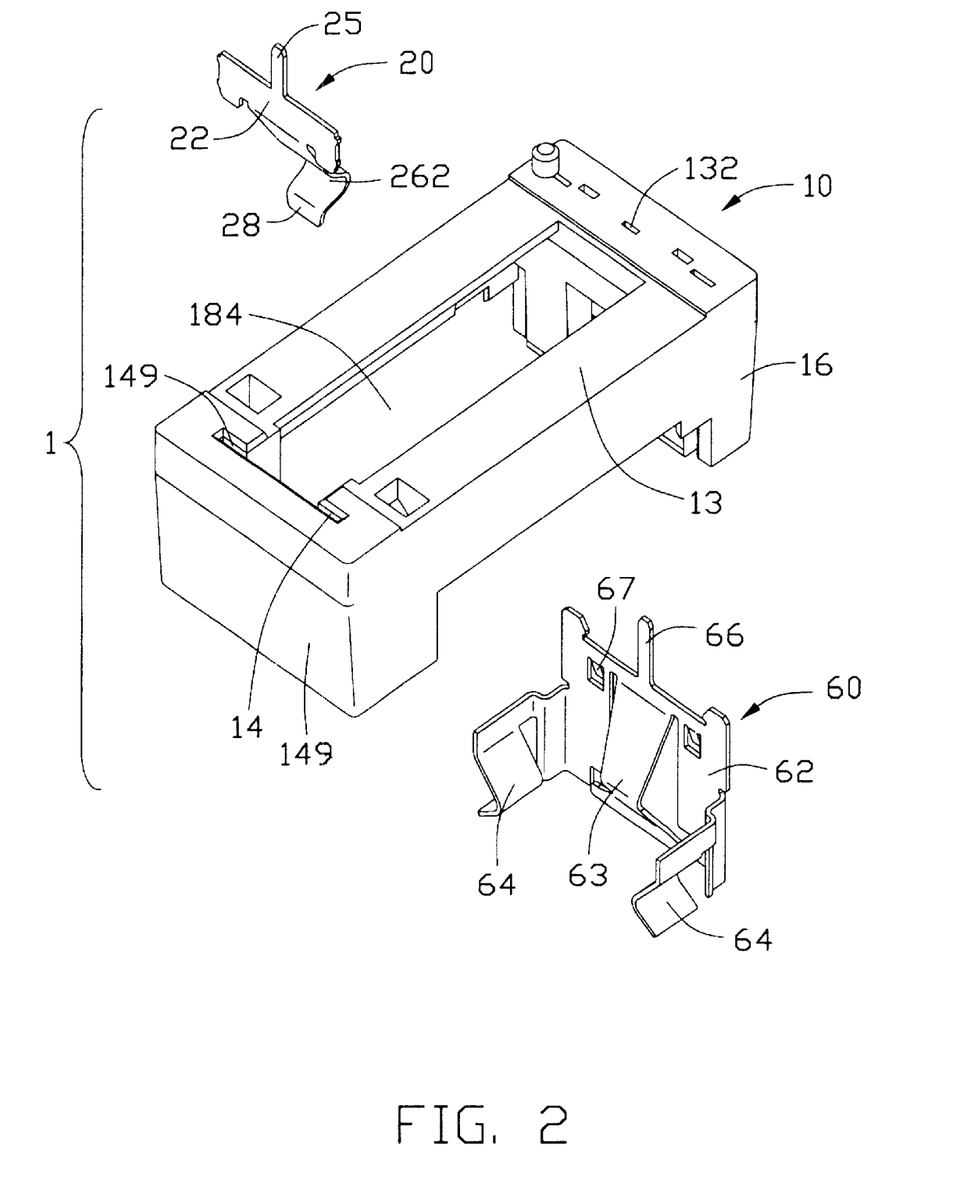
FIG. 2 is another exploded perspective view of the battery holder of FIG. 1.
Figure 3:
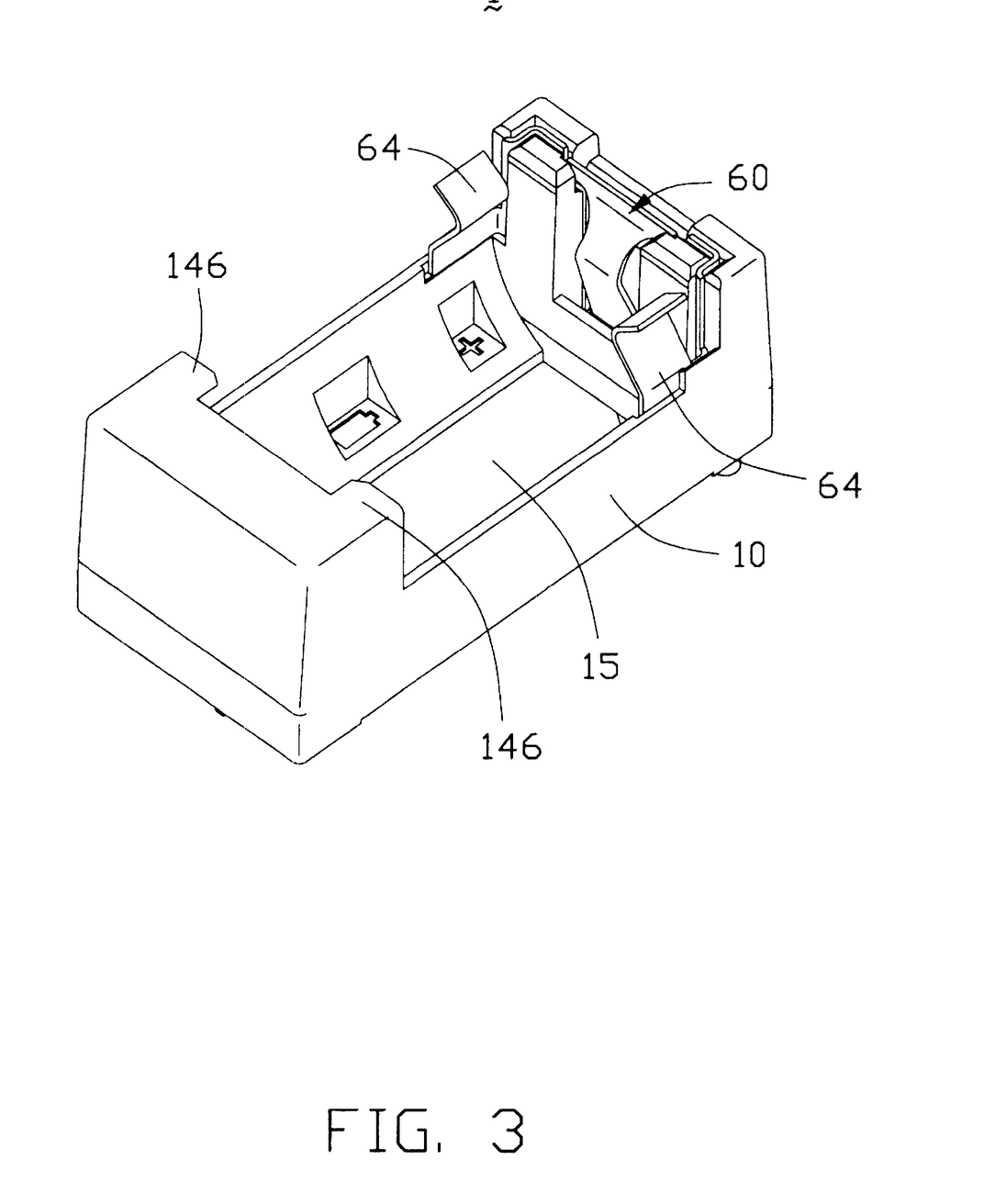
FIG. 3 is an assembled perspective view of FIG. 1.
Figure 4:
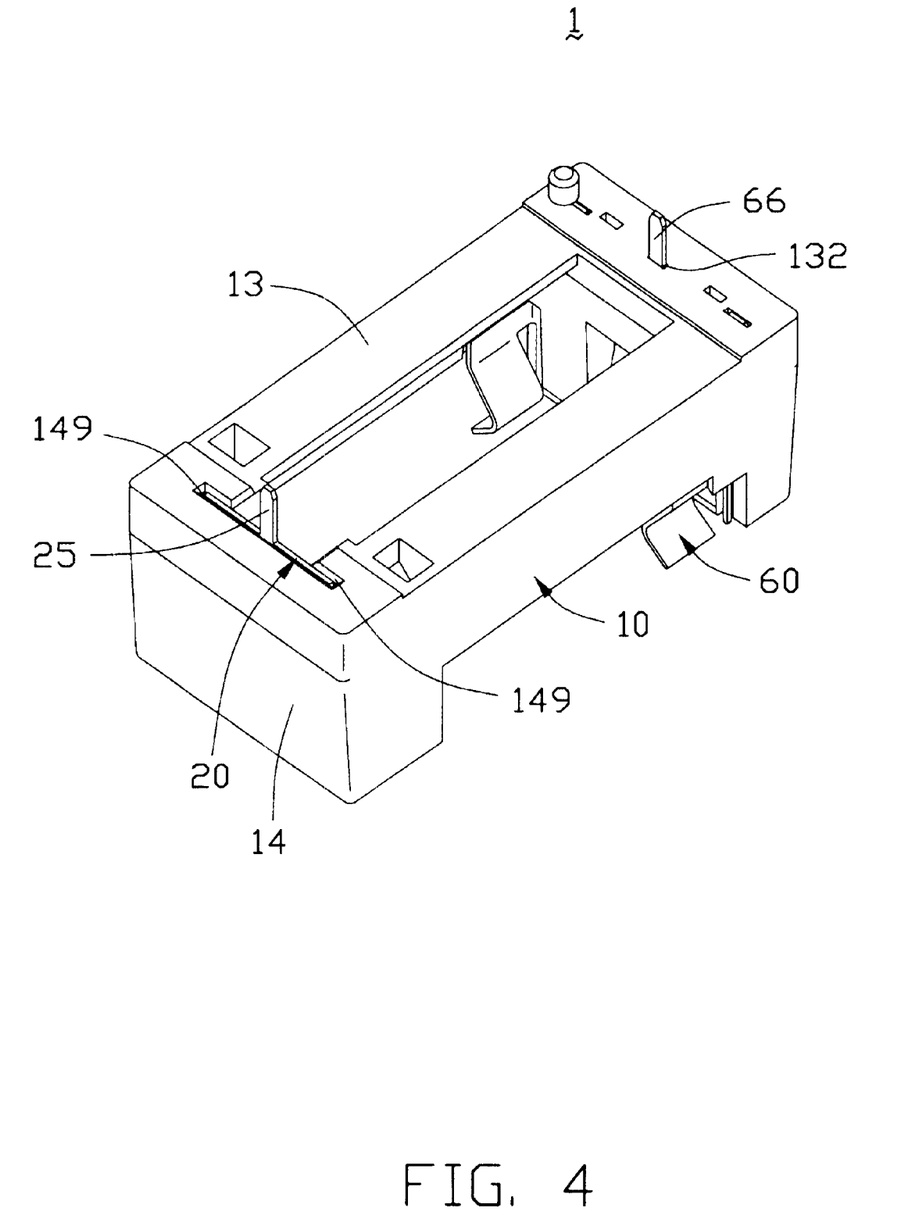
FIG. 4 is an assembled perspective view of FIG. 2.
Figure 5:
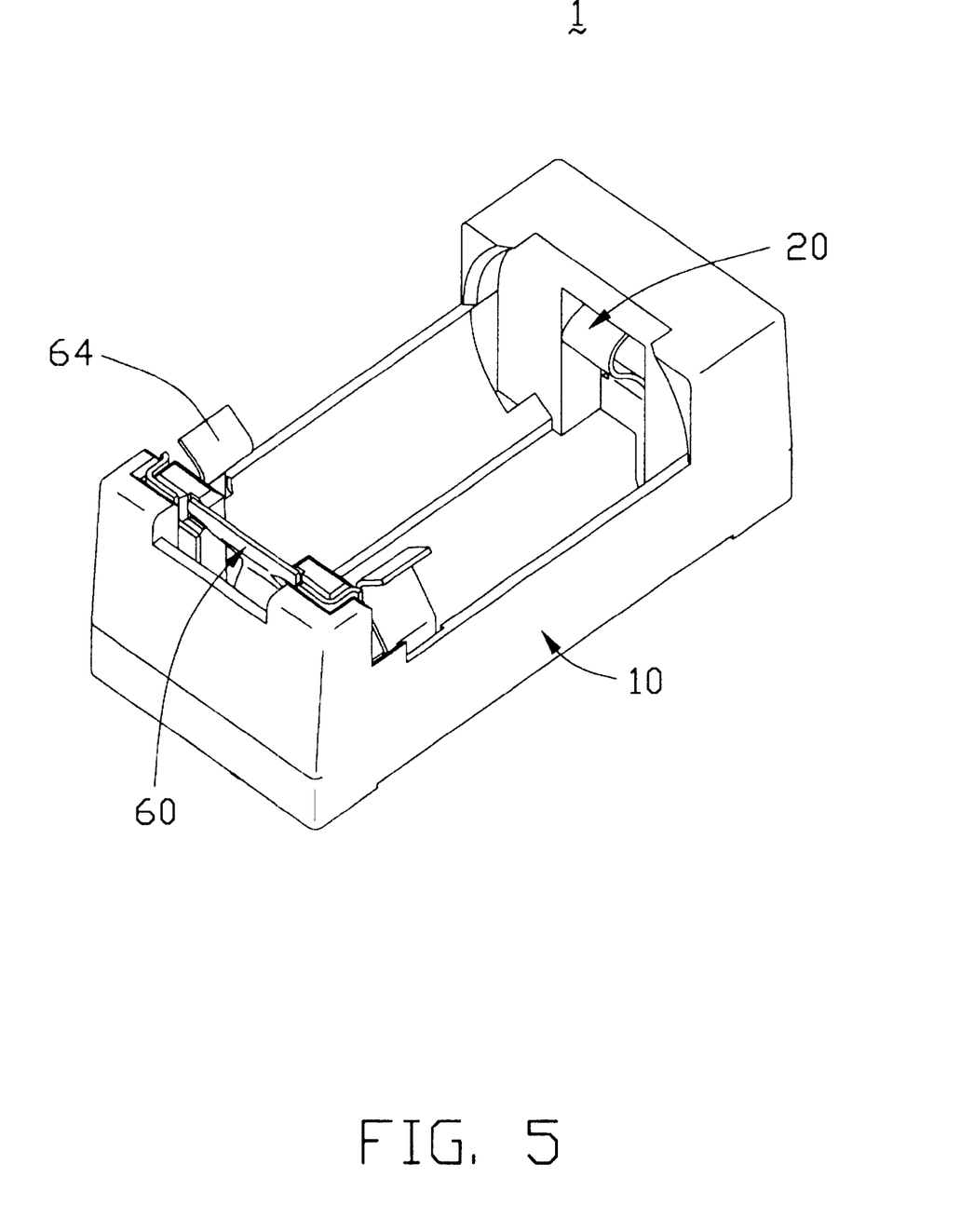
FIG. 5 is another perspective view of FIG. 3.
Figure 6:
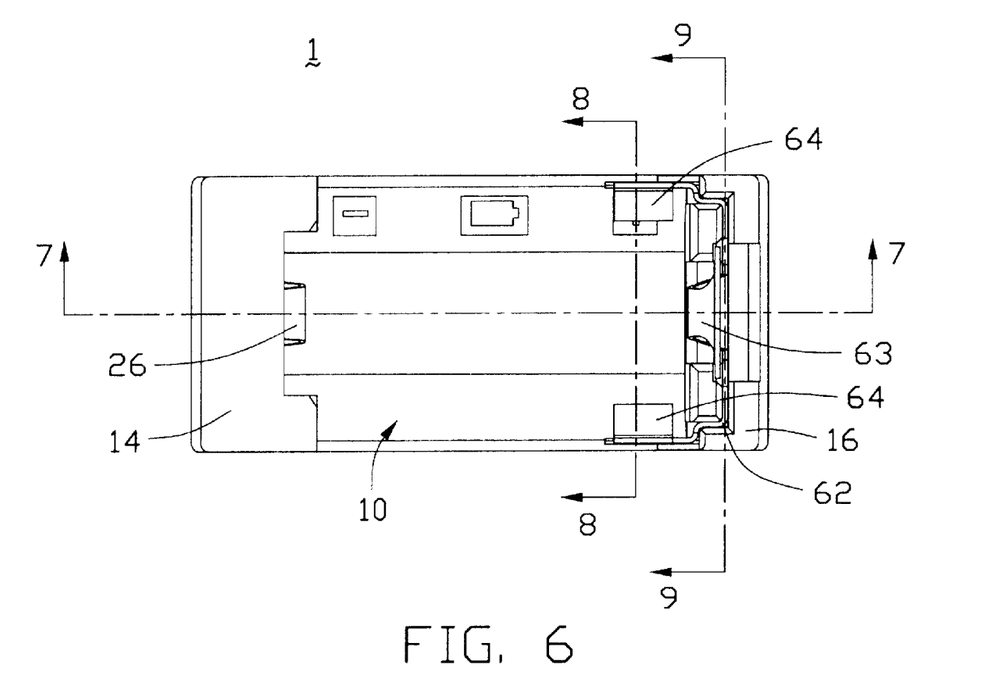
FIG. 6 is a top view of FIG. 3.
Figure 7:
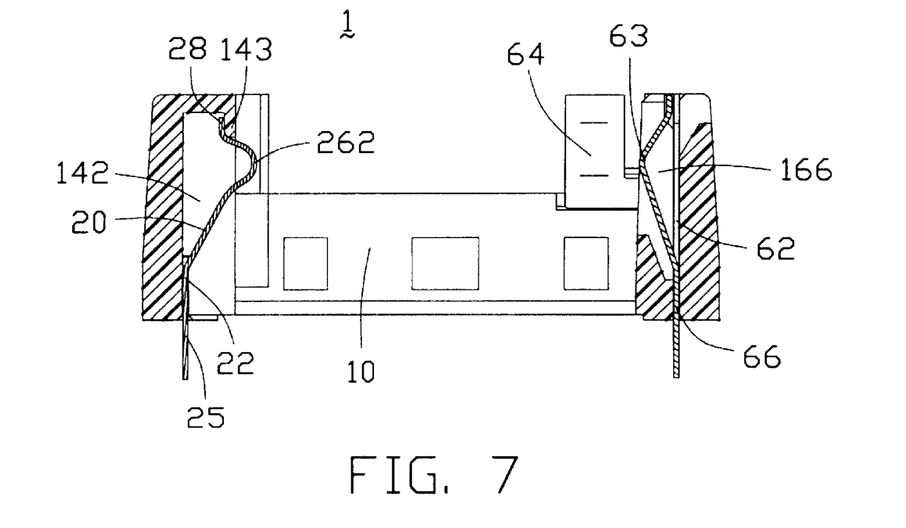
FIG. 7 is a cross-sectional view taken along line 7—7 of FIG. 6.
Figure 8:
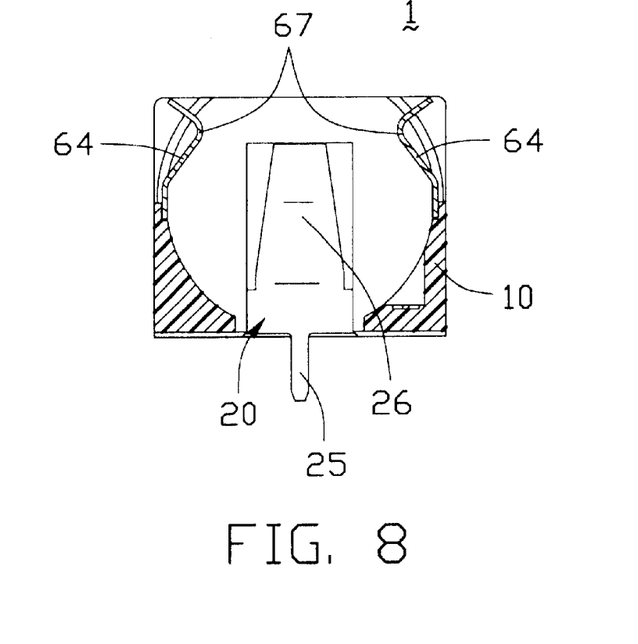
FIG. 8 is a cross-sectional view taken along line 8—8 of FIG. 6.
Figure 9:
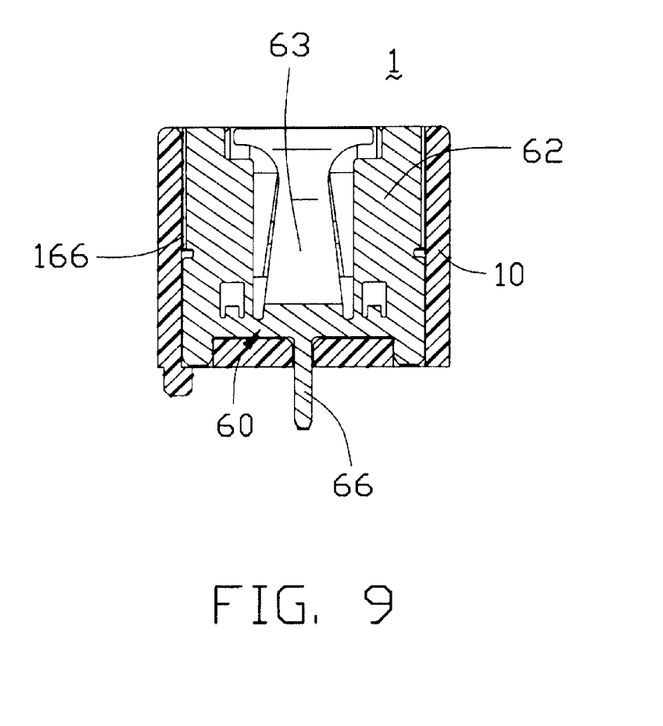
FIG. 9 is a cross-sectional view taken along line 9—9 of FIG. 6.

Further referring to FIG. 7, the front end block 14 defines an elongate recess 142 communicating with the receiving space 15 for receiving the first conductive contact 20 and a pair of slits 149 in the bottom surface 13 and communicating with the recess 142. The front end block 14 forms a stopping bar 143 at an upper portion thereof and a pair of flanges 146 projecting from opposite ends of the stopping bar 143 toward the receiving space 15. The rear end block 16 of the holder body 12 has an inner surface 162 adjacent to which two opposite raised portions 164 are formed and connected by a cross bar 168 therebetween. A notch 163 is defined therebetween the raised portions 164 and the cross bar 168. A receiving slit 166 is formed between each raised portion 164 and the inner surface 162 of the rear end block 16 and communicates with the notch 163 for receiving the second conductive contact 60. Additionally, a through hole 132 is defined in the bottom face 13 of the housing 10 and communicates with the receiving slit 166.

The first conductive contact 20, serving as a negative electrode of the battery holder 1, comprises a base section 22 having opposite, barbed edges 24 to be interferentially retained in the slits 149 of the front end block 14. A spring arm 26, in a convex shape, extends from the base section 22 and substantially runs along the elongate recess 142, and has a convex portion 262 and a free end 28 extending from the convex portion 262. The convex configuration of the spring arm 26 ensures the sparing arm 26 to be resilient enough to have a reliable engagement with the negative terminal 44 of the battery 40 when the battery 40 is inserted into the battery holder 1. A soldering tail 25 extends from the base section 22 in a direction substantially opposite to the spring arm 26. The soldering tail 25 projects beyond the bottom surface 13 of the holder body 12 for being soldered to the circuit board (not shown).

The second contact 60, serving as a positive electrode of the battery holder 1, is received in the receiving slit 166 of the rear end block 16. The second blade 60 comprises a substantially planar base section 62, a curved resilient beam 63 extending from the base section 62, two clip members 64 formed on opposite lateral sides of the base section 62 and a soldering tail 66 depending from the base section 62. The base section 62 is disposed in the receiving slits 166 of the rear end block 16 and the curved resilient beam 63 is located in the notch 163 for conductively contacting with the positive terminal 46 of the battery 40. Additionally, a pair of barbs 67 are formed on the base section 62 and project outwardly to interferentially engage with the rear end block 16 to secure the second contact 60 in position. The soldering tail 66 extends through the hole 132 and beneath the bottom face 13 of the housing 10 for soldering to the circuit board. The clip members 64 vertically extend from upper portions of the lateral sides of the base section 62, wherein the lateral sides extend perpendicularly from lateral edges of the base section 62 towards a middle of the battery holder 1, and form a pair of curved projections 65 facing with each other. The projections 65 are thus formed to have a predetermined resiliency so that they can exert a clamping force to the circumferential periphery 45 of the battery 40, thereby preventing the battery 40 from moving out of its installed position when it is inserted in the receiving space 15 of the battery holder 1.

In assembly, referring to FIGS. 3 to 9, the negative blade 20 is inserted into the elongate recess 142 of the front end block 14 from a position above the housing 10 to a position where the barbed edges 24 thereof are interferingly retained in the receiving slits 149, and the free end 28 thereof is abutted against the stopping bar 143. The positive contact 60 is then inserted into the receiving slits 166 of the rear end block 16 from a position above of the housing 10 to a position wherein the barbs 67 thereof are interferringly retained in the slit 166 for holding the positive contact 60 in position. The soldering tail 66 of the second contact 60 extends through the hole 132 and beneath the bottom face 13 for soldering to the circuit board. Meanwhile, the resilient beam 63 of the base section 62 is positioned in the notch 163 between the raised portions 164.

In use, referring to FIGS. 10 to 13, the battery 40 is inserted into the receiving space 15 of the housing 10 and the negative and positive terminals 44, 46 thereof are conductively contacted with the curved portion 262 of the negative contact 20 and the resilient beam 63 of the positive contact 60, respectively. Meanwhile, the curved projections 65 of the clip members 64 exert a clamping force against an upper portion of the circumferential periphery 45 of the battery 40 for preventing the battery 40 from moving out of the housing 10 due to vibration or unexpected force occurred to the holder 1/battery 40 assembly. Thus, reliable electrical connections between the negative and positive terminals 44, 46 of the battery 40 and the negative and positive contacts 20, 60 of the holder 1 are effectively ensured by the clip members 64 of the present invention.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A battery holder adapted to retain an elongate battery having opposite first and second terminals at opposite end faces of the battery, comprising:

an insulative housing having opposite side walls and opposite first and second end blocks connected with the side walls to cooperatively define a receiving space therebetween adapted for receiving a battery; and a pair of first and second conductive contacts being respectively engaged with the first and second end blocks, each of the first and second conductive contacts forming a base portion, a spring arm extending from one end of the base section adapted for electrically connecting with one of the first and second electrical terminals of the battery, and a soldering tail extending from another end of the base portion adapted for soldering to a circuit board; wherein the insulative housing has a pair of raised portions and a respective slit between each raised portion and the second end block; and the base section of the second conductive contact is substantially planar and is received in the slits, the second conductive contact further forms a pair of clip members bent about the base section near the slits and extending from opposite lateral sides of the base section thereof, each clip upwardly extending to form a curved projection adapted for exerting a clamping force against a circumferential periphery of the battery when the battery is disposed in the receiving space.

2. The battery holder as claimed in claim 1, wherein the first end block defines a recess in an inner surface thereof and communicating with the receiving space for receiving the first conductive contact.

3. The battery holder as claimed in claim 2, wherein the first end block forms a stopping bar adjacent to the recess, and wherein the spring arm of the first conductive contact has a free end abutted against the stopping bar.

4. The battery holder as claimed in claim 3, wherein the base section of the first conductive contact forms several barbs on opposite sides thereof to be interferingly retained in the recess.

5. The battery holder as claimed in claim 1, wherein the second end block defines a slit for receiving the base section of the second conductive contact.

6. The battery holder as claimed in claim 5, wherein the base section of the second conductive contact forms several barbs for interferingly engaging with the slit.

7. The battery holder as claimed in claim 6, wherein each clip member extends vertically from an upper portion of the lateral side of the base section of the second conductive contact and forms a curved projection for abutting against an upper portion of the outer surface of the battery.

8. A battery holder assembly comprising:

an elongate battery having negative and positive terminals on opposite ends thereof, respectively;

a battery holder holding the battery and adapted for to electrically connecting the battery to a circuit board, comprising, a dielectric housing defining a receiving space receiving the battery therein and having opposite first and second end blocks, and negative and positive conductive contacts secured to opposite ends of the dielectric housing, each of the contacts forming a base section retained in the dielectric housing, a resilient beam conductively contacting a corresponding terminal of the battery, and a soldering tail adapted for soldering to the circuit board; wherein the insulative housing has a pair of raised portions and a respective slit between each raised portion and the second end block;

the base section of the positive conductive contact is substantially planar and is received in the slits; and one of the pair of negative and positive conductive contacts further forms a pair of clip members extending from opposite sides of the base section thereof, the clip members exerting a clamping force against a circumferential periphery of the battery to thereby hold the battery in the receiving space; wherein the first end block defines a recess in an inner surface thereof and communicating with the receiving space for receiving the negative conductive contact; wherein the first end block forms a stopping bar adjacent to the recess, and wherein the resilient beam of the negative conductive contact has a free end abutted against the stopping bar.

9. The battery holder as claimed in claim 8, wherein the base section of the negative conductive contact forms several barbs on opposite sides thereof to be interferingly retained in the recess.

10. The battery holder as claimed in claim 8, wherein the base section of the positive conductive contact forms several barbs for interferingly engaging with the slit.

11. The battery holder as claimed in claim 8, wherein each clip member extends vertically from an upper portion of the lateral side of the base section of the positive conductive contact and forms a curved projection for abutting against an upper portion of the outer surface of the battery.

* * * * *